United States Patent
Dimitrakopoulos et al.

(10) Patent No.: US 7,357,977 B2
(45) Date of Patent: Apr. 15, 2008

(54) ULTRALOW DIELECTRIC CONSTANT LAYER WITH CONTROLLED BIAXIAL STRESS

(75) Inventors: Christos Dimitrios Dimitrakopoulos, Somers, NY (US); Stephen McConnell Gates, Ossining, NY (US); Alfred Grill, White Plains, NY (US); Michael Wayne Lane, Cortlandt Manor, NY (US); Eric Gerhard Liniger, Sandy Hook, CT (US); Xiao Hu Liu, Croton On Hudson, NY (US); Son Van Nguyen, Yorktown Heights, NY (US); Deborah Ann Neumayer, Danbury, CT (US); Thomas McCarroll Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 11/034,479

(22) Filed: Jan. 13, 2005

(65) Prior Publication Data
US 2008/0044668 A1 Feb. 21, 2008

(51) Int. Cl.
*H01L 23/52* (2006.01)
*H01L 23/58* (2006.01)

(52) U.S. Cl. ............... 428/312.6; 174/138 R; 257/632; 257/646; 257/E21.277; 428/304.4; 428/315.7; 438/789; 438/790

(58) Field of Classification Search ........... 174/138 R; 257/632, 646, E21.277; 428/304.4, 312.6, 428/315.7; 438/789, 790
See application file for complete search history.

(56) References Cited

U.S. PATENT DOCUMENTS

| 2005/0156285 A1* | 7/2005 | Gates et al. ............... 257/632 |
| 2005/0194619 A1* | 9/2005 | Edelstein et al. ........... 257/232 |
| 2006/0079099 A1* | 4/2006 | Nguyen et al. ............. 438/789 |

* cited by examiner

*Primary Examiner*—John J. Zimmerman
*Assistant Examiner*—Aaron Austin
(74) *Attorney, Agent, or Firm*—Scully, Scott, Murphy & Presser, P.C.; Robert M. Trapp, Esq.

(57) ABSTRACT

A method for forming a ultralow dielectric constant layer with controlled biaxial stress is described incorporating the steps of forming a layer containing Si, C, O and H by one of PECVD and spin-on coating and curing the film in an environment containing very low concentrations of oxygen and water each less than 10 ppm. A material is also described by using the method with a dielectric constant of not more than 2.8. The invention overcomes the problem of forming films with low biaxial stress less than 46 MPa.

7 Claims, 10 Drawing Sheets

ULTRALOW DIELECTRIC CONSTANT LAYER WITH CONTROLLED BIAXIAL STRESS

CROSS-REFERENCE TO RELATED APPLICATIONS

The present application is related to co-assigned U.S. Pat. Nos. 6,147,009, 6,312,793, 6,441,491, 6,437,443, 6,541,398, 6,479,110, 6,497,963, 6,756,323, 6,770,573 and 6,790,789 the contents of which are incorporated herein by reference. The present application is also related to co-pending and co-assigned U.S. patent application Ser. Nos. 10/390,801, filed Mar. 18, 2003, and 10/758,724, filed Jan. 16, 2004, the entire contents of each of the aforementioned U.S. patent applications are also incorporated herein by reference.

FIELD OF THE INVENTION

The present invention generally relates to a method for controlling the level of biaxial stress in a dielectric layer that has a low or ultralow dielectric constant (low k or ultralow k) and a tool design that enables fabrication of such dielectric layers and electronic devices containing such dielectric layers. More particularly, the present invention relates to a method for fabricating low stress ultralow k films for use as an intralevel or interlevel dielectric in an ultra-large-scale integration ("ULSI") back-end-of-the-line ("BEOL") wiring structure and an electronic structure formed by such a method.

BACKGROUND OF THE INVENTION

The continuous shrinking in dimensions of electronic devices utilized in ULSI circuits in recent years has resulted in increasing the resistance of the BEOL metallization. The wiring capacitance increases due to the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce capacitance. The low k dielectric materials (i.e. low k dielectrics) that have been considered for applications in ULSI devices include materials containing elements of Si, C, O and H, such as methylsiloxane, methylsilsesquioxanes, and other organic and inorganic polymers. Such materials can be deposited by means of spin-coating or Plasma Enhanced Chemical Vapor Deposition (PECVD).

One of the problems encountered when these materials are integrated into BEOL interconnect wiring structures is that they have the tendency to crack, especially in high humidity environments. The driving force for cracking is proportional to the square of the biaxial stress present in the low k dielectric layer. Reducing biaxial stress is very important for minimizing cracking in a low k dielectric layer Despite years of work on low and ultralow k dielectric materials, there is a continued need for developing methods for controlling and reducing the biaxial stress in low and ultralow k dielectric layers and designing tools intended for the fabrication of low and ultralow k dielectric layers with low and controllable biaxial stress at room temperature and at the operating temperature of the intended devices that will comprise such layers.

SUMMARY OF THE INVENTION

The present invention provides: a method for controlling and reducing the biaxial stress in low and ultralow k dielectric layers; the design of a tool (s) intended for the fabrication of low and ultralow k dielectric layers with low and controllable biaxial stress at room temperature and at the operating temperature of the intended structure such as electronic devices; and structures such as interconnects on a chip designed and fabricated using low and ultralow k dielectric layers with low and controllable biaxial stress.

The present invention further provides electronic structure(s) incorporating layers of insulating materials as intralevel or interlevel dielectrics in a back-end-of-the-line ("BEOL") wiring structure of a semiconductor chip or electronic device in which at least two of the layers of insulating materials comprise an ultralow k material whose stress is controlled using the methods described in the present invention.

Still further, the present invention provides an electronic structure, which comprises layers of the inventive ultralow k material, whose stress is controlled using the methods described in the present invention, as intralevel or interlevel dielectrics in a back-end-of-the-line ("BEOL") wiring structure and which further contains at least one dielectric cap layer functioning as a reactive ion etch ("RIE") stop, a chemical-mechanical polish stop or a diffusion barrier.

In accordance with the present invention, a method for fabricating a thermally stable dielectric layer, whose stress is controlled using the methods described in the present invention and which has a covalently bonded random tri-dimensional network or matrix comprising Si, C, O, and H atoms and an atomic level nanoporosity, is provided.

In a first embodiment, the dielectric material has a covalently bonded random tri-dimensional network or matrix that consists essentially of Si, C, O, and H having controlled biaxial stress.

The present invention further provides an electronic structure (i.e., substrate) that has layers of insulating materials as intralevel or interlevel dielectrics used in a back-end-of-the-line ("BEOL") wiring structure, wherein the insulating material can be the ultralow k film of the present invention whose stress is controlled using the methods described in the present invention.

In a second embodiment, there is provided a method for fabricating a thermally stable ultralow k film comprising the steps of: providing a plasma enhanced chemical vapor deposition ("PECVD") reactor; positioning an electronic structure (i.e., substrate) in the reactor; flowing a first silicon-containing precursor gas comprising atoms of Si, C, O, and H into the reactor; flowing a second organic-containing precursor gas mixture comprising atoms of C, H and optionally O, F and N into the reactor; depositing an ultralow k film on the substrate; cooling down the substrate to room temperature before exposing it to an oxidizing atmosphere (e.g. to an atmosphere containing oxygen at a concentration more than, for example, 100 ppm and preferably 10 ppm) or transferring the wafer to the area of the next process step (e.g. curing) without exposing it to an oxidizing atmosphere (e.g. to an atmosphere containing oxygen at a concentration more than, for example, 100 ppm and preferably 10 ppm); optionally curing the as-deposited film in one or more steps in a non-oxidizing atmosphere (e.g. to an atmosphere containing oxygen at a concentration less than, for example, 100 ppm and preferably 10 ppm).

In a third embodiment, there is provided a method for fabricating a thermally stable ultralow k film comprising the steps of: depositing an ultralow k film on the substrate by means of spin-coating a solution containing a material comprising atoms of Si, C, O, and H; optionally curing the as-deposited film in one or more steps in a non-oxidizing atmosphere (e.g. to an atmosphere containing oxygen at a concentration less than, for example, 10 ppm).

By curing, we mean that the deposited film of the present invention can be heat treated at a temperature of not less than about 300° C. for a time period of at least about 0.25 hour in a non-oxidizing atmosphere (e.g. to an atmosphere containing oxygen at a concentration less than, for example, 10 ppm). Alternatively, the deposited film of the present invention can be treated by ultra violet (UV) radiation, an e-beam (EB) or a laser, as described, for example, in U.S. patent application Ser. No. 10/758,724 by Dimitrakopoulos et al. filed Jan. 16, 2004 and assigned to the assignee herein, the content of which is incorporated herein by reference, in a non-oxidizing atmosphere (e.g. an atmosphere containing oxygen at a concentration less than about 10 ppm).

The heat-treating step may further be conducted at a temperature not higher than about 300° C. for a first time period and then at a temperature not lower than about 380° C. for a second time period, the second time period being longer than the first time period. The second time period may be at least about 10 times the first time period. The thermally treated film may optionally be treated by exposure to UV radiation or e-beam, such as described in U.S. patent application Ser. No. 10/758,724 by Dimitrakopoulos et al. filed Jan. 16, 2004. All of the above described steps are performed in a non-oxidizing atmosphere (e.g. an atmosphere containing oxygen at a concentration less than about 10 ppm).

In a fourth embodiment, the inventive method may further comprise one or more annealing steps which are conducted in an oxygen-free environment. As used herein, the words "oxygen-free environment" describe an environment for treating the dielectric film, said environment being a gas comprising an inert gas such as $N_2$, Ar, He, Xe, or a mixture thereof, and containing a concentration of $O_2$ less than 10 ppm.

In a fifth embodiment, the inventive method may further comprise the step of treating the film with UV radiation or an e-beam in an oxygen-free environment, less than 10 ppm $O_2$.

In a sixth embodiment the inventive method may alternatively or additionally comprise the step of applying microwave or RF power to the wafer, a step that is conducted in an oxygen-free environment, less than 10 ppm $O_2$.

In a seventh embodiment, the invention is directed to an electronic structure which has layers of insulating materials as intralevel or interlevel dielectrics, whose stress is controlled using the methods described in the present invention, in a back-end-of-the-line ("BEOL") interconnect structure which includes a pre-processed semiconducting substrate that has a first region of metal embedded in a first layer of insulating material, a first region of conductor embedded in a second layer of insulating material of the inventive ultralow k dielectric which comprises Si, C, O and H, and a multiplicity of nanometer-sized pores, and having a dielectric constant of not more than about 2.8, the second layer of insulating material being in intimate contact with the first layer of insulating material, the first region of conductor being in electrical communication with the first region of metal, and a second region of conductor being in electrical communication with the first region of conductor and being embedded in a third layer of insulating material comprising the inventive ultralow k dielectric, the third layer of insulating material being in intimate contact with the second layer of insulating material. The electronic structure may further comprise a first dielectric cap layer situated in-between the second layer of insulating material and the third layer of insulating material. The electronic structure may further comprise a second dielectric cap layer between the second layer of insulating material and the third layer of insulating material, and a third dielectric cap layer on top of the third layer of insulating material.

The first dielectric cap material may be selected from silicon oxide, silicon nitride, silicon oxynitride, silicon carbon nitride (SiCN), silicon carbon oxynitride (SiCON), refractory metal silicon nitride (wherein the refractory metal is selected from the group consisting of Ta, Zr, Hf and W), silicon carbide, carbon doped oxide or SiCOH and hydrogenated compounds thereof. The second and the third dielectric cap layers may be selected from the same group of dielectric materials. The first layer of insulating material may be silicon oxide or silicon nitride or doped varieties of these materials, such as phosphorus silicate glass ("PSG") or boron phosphorus silicate glass ("BPSG"). The electronic structure may further include a diffusion barrier layer of a dielectric material deposited on at least one of the second and third layers of insulating material. The electronic structure may further comprise a dielectric on top of the second layer of insulating material, which functions as a reactive ion etch ("RIE") hard mask and polish stop layer and a dielectric diffusion barrier layer may be on top of the dielectric RIE hard mask and polish stop layer.

The electronic structure may further comprise a first dielectric RIE hard mask/polish-stop layer on top of the second layer of insulating material, a second dielectric RIE hard mask/diffusion barrier layer on top of the first dielectric polish-stop layer, a second dielectric RIE hard mask/polish-stop layer on top of the third layer of insulating material, and a second dielectric diffusion barrier layer on top of the second dielectric polish-stop layer. The electronic structure may further comprise a dielectric cap layer of the same materials as mentioned above, between an interlevel dielectric of ultralow k dielectric and an intralevel dielectric of ultralow k dielectric.

BRIEF DESCRIPTION OF THE DRAWINGS

The foregoing objects, features and advantages of the present invention will become apparent from the following detailed description and the appended drawings in which.

DETAILED DESCRIPTION OF THE INVENTION

Figure 1:
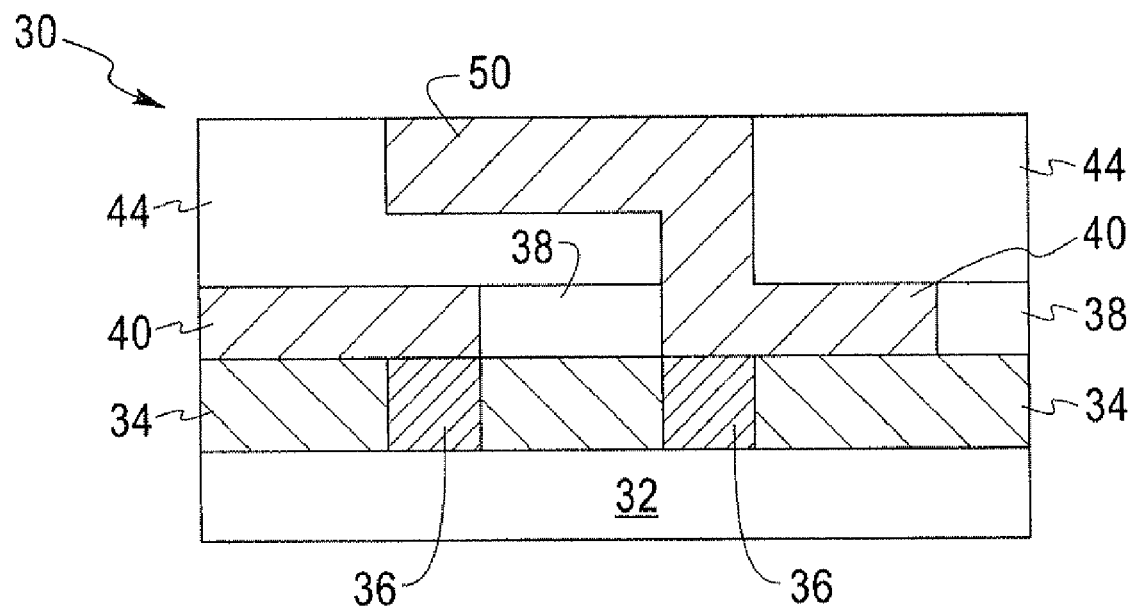
FIG. 1 is a cross section view of an electronic device 30.

The present invention provides a method for preparing a layer that has an ultralow k, i.e., lower than about 2.8, which is suitable for integration in a BEOL wiring structure and whose biaxial stress is controlled using the means described in the present invention. More preferably, the dielectric constant for the inventive ultralow k film is from about 1.5 to about 2.8 and, most preferably, the dielectric constant is from about 1.8 to about 2.25.

In the deposition process, the SiCOH dielectric material is formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming the SiCOH dielectric material. Further, the first precursor mixed with an oxidizing agent such as $O_2$, $CO_2$ or a combination thereof, thereby stabilizing the reactants in the reactor and improving the uniformity of the dielectric film deposited on the substrate.

In addition to the first precursor, a second precursor (gas, liquid or vapor) comprising atoms of C, H, and optionally O, F and N can be used. Optionally, a third precursor (gas, liquid or gas) comprising Ge may also be used.

Preferably, the first precursor is selected from organic molecules with ring structures comprising SiCOH components such as 1, 3, 5, 7-tetramethylcyclotetrasiloxane ("TM-CTS" or "$C_4H_{16}O_4Si_4$"), ocgtamethylcyclotetrasiloxane (OMCTS), diethoxymethylsilane (DEMS), dimethyldimethoxysilane (DMDMOS), diethylmethoxysilane (DIDMOS), and related cyclic and non-cyclic silanes, siloxanes and the like.

The second precursor that may be used is a hydrocarbon molecule. Although any hydrocarbon molecule may be used preferably the second precursor is selected from the group consisting of hydrocarbon molecules with ring structures, preferably with more than one ring present in the molecule or with branched chains attached to the ring. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$"). Also useful are molecules containing branched tertiary butyl (t-butyl) and isopropyl (i-propyl) groups attached to a hydrocarbon ring; the ring may be saturated or unsaturated (containing C=C double bonds). The third precursor may be formed from germane hydride or any other reactant comprising a source Ge.

The method of the present invention may further comprise the step of providing a parallel plate reactor, which has a conductive are of a substrate chuck between about 85 cm2 and about 750 cm2, and a gap between the substrate and a top electrode between about 1 cm and about 12 cm. A high frequency RF power is applied to one of the electrodes at a frequency between about 0.45 MHz and about 200 MHz. Optionally, an additional low frequency power can be applied to one of the electrodes.

The conditions used for the deposition step may vary depending on the desired final dielectric constant of the SiCOH dielectric material. Broadly, the conditions used for providing a stable dielectric material comprising elements of Si, C, O, H that has a dielectric constant of about 2.8 or less, a tensile stress of less than 45 MPa, an elastic modulus from about 2 to about 15 GPa, and a hardness from about 0.2 to about 2 GPa include: setting the subvstrate temperature at between about 300C and about 425C; setting the high frequency RF power density at between about 0.1 W/cm2 and about 1.5 W/cm2; setting the first liquid precursor flow rate at between about 100 mg/min and about 5000 mg/min, optionally setting the second liquid precursor flow rate at between about 50 mg/min to about 10,000 mg/min; optionally setting the third liquid precursor flow rate at between about 25 mg/min to about 4000 mg/min; optionally setting the inert carrier gases such as Helium (or/and Argon) flow rate at between about 50 sccm to about 5000 sccm; setting the ractor pressure at a pressure between about 1000 mTorr and about 7000 mTorr; and setting the high frequency RF power between about 75 W and about 1000 W. Optionally, an ultra low frequency power may be added to the plasma between about 30 W and about 400 W. When the conductive area of the substrate chuck is also changed by a factor of X, the RF power applied to the substrate chuck is also changed by a factor of X.

When an oxidizing agent is employed, it is flown into the PECVD reactor at a flow rate between about 10 sccm to about 1000 sccm.

While liquid precursors are used in the above process, it is known in the art that the organosilicon gas phase precursors (such as trimethylsilane) can also be used for the deposition.

The film resulting from the above process is called herein the "as-deposited film".

Within the present invention, the ambient for thermal, UV, EB, laser, or RF treatment of an as-deposited SiCOH film is done in an environment comprising an inert gas such as $N_2$, $H_2$, Ar, He, Xe, or other noble gas or a hydrocarbon gas or a mixture thereof, and containing a concentration of $O_2$ in the range from 0 to 100 ppm and preferably 10 ppm.

A non-oxidizing (no oxygen) environment may include a hydrocarbon ambient preferably with double bond groups and with the oxygen level less than 100 ppm and preferably 10 ppm to passivate the reactive sites such as dangling bonds from silicon oxygen after curing and to reduce the SiCOH and porous SiCOH film oxidation. The hydrocarbon ambient with double bond groups may include ethylene or 1,3 butadiene.

Specifically, the as-deposited film can be optionally treated using an energy source, in accordance with the Ser. No. 10/758,724 application, to stabilize the film and improve its properties (electrical, mechanical, adhesive), resulting in a final optimum film. Suitable energy sources include thermal, chemical, ultraviolet (UV) light, electron beam (e-beam), microwave, and plasma. Combinations of the aforementioned energy sources can also be used. The energy sources employed in the present invention are utilized to modify the Si—O bonding network of the as deposited dielectric, modify other bonds in the material, cause more Si—O cross-linking, and in some cases to remove the hydrocarbon phase, with all of the aforementioned modifications resulting in a higher elastic modulus, a higher hardness, or a lower biaxial stress, or a combination of said properties. With all other parameters being the same, either a higher elastic modulus or a lower stress or both of the above, result in a lower crack propagation velocity as measured under water, with the combination of higher elastic modulus and lower stress being a preferred result of the energy treatment.

The thermal energy source includes any source such as, for example, a heating element or a lamp, that can heat the deposited dielectric material to a temperature from about 300° to about 500° C. More preferably, the thermal energy source is capable of heating the deposited dielectric material to a temperature from about 350° to about 430° C. This thermal treatment process can be carried out for various time periods, with a time period from about 1 minute to about 300 minutes being typical. The thermal treatment step is typically performed in the presence of an inert gas such as He and Ar. The thermal treatment step may be referred to as an anneal step in which rapid thermal anneal, furnace anneal, laser anneal or spike anneal conditions are employed.

The UV light treatment step is performed utilizing a source that can generate light having a wavelength from about 500 to about 150 nm, to irradiate the substrate while the wafer temperature is maintained at 25° to 500° C., with temperatures from 300° to 450° C. being preferred. Radiation with a wavelength greater than 370 nm is of insufficient energy to dissociate or activate important bonds such as $S_1$—$CH_3$ and Si—H, so the wavelength in the range from 150 to 370 nm is a preferred range. Using literature data and absorbance spectra measured on as-deposited films, the inventors have found that radiant energy having a wavelength less than 170 nm may not be favored due to degradation of the SiCOH film. Further, radiant energy having a wavelength in the range from 310 to 370 nm is less useful than radiant energy having a wavelength in the range from 150 to 310 nm, due to the relatively low energy per photon for wavelengths in the range from 310 to 370 nm. Within the wavelength range from 150 to 310 nm, optimum wavelength overlap with the absorbance spectrum of the as deposited film and minimum degradation of the film properties (such as hydrophobicity) may be optionally used to select a most effective region of the UV spectrum for changing the SiCOH properties.

The electron beam treatment step is performed utilizing a source that is capable of generating a uniform electron flux over the surface of the wafer, with energies from 0.5 to 25 keV and current densities from 0.1 to 100 microAmp/cm$^2$ (preferably 1 to 5 microAmp/cm$^2$), while the wafer temperature is maintained in the range from 25° to 500° C., with temperatures in the range from 300° to 450° C. being preferred. The preferred dose of electrons used in the electron beam treatment step is in the range from 50 to 500 microcoulombs/cm$^2$, with a dose of electrons from 100 to 300 microcoulombs/cm$^2$ (i.e. μC/cm$^2$) being most preferred.

The as-deposited films are stabilized before undergoing further integration processing. A stabilized film is a film where the vapor components in the as-deposited film have been driven off. The stabilization process can be performed in a furnace-annealing step at about 300° C. to about 430° C. for a time period between about 0.5 hours and about 4 hours. The stabilization process can also be performed in a rapid thermal annealing process at temperatures above about 300° C. The stabilization process can also be performed in a UV or e-beam chamber at temperatures above 300° C. The dielectric constants of the films obtained according to the present invention are lower than about 2.8. The thermal stability of the films obtained according to the present invention in a non-oxidizing ambient i.e. less than 10 ppm $O_2$ is from room temperature and below up to at least a temperature of about 430° C. A film having thermal stability is a film that does not change in composition or properties at temperatures from room temperature and below up to about 430C.

Several cross section views of electronic devices formed in accordance to the present invention are shown in FIGS. 1-4. It should be noted that the devices shown in FIGS. 1-4, are merely illustrated as examples according to the present invention, while countless other devices can also be formed according to the present invention.

FIG. 1 depicts a cross section view of an electronic device 30 that is built on a silicon or silicon containing substrate 32. On top of silicon or silicon containing substrate 32, insulating material layer 34 is formed with a first region of metal 36 embedded therein. After a chemical mechanical polishing ("CMP") process is conducted on first region of metal 36, a film such as an ultralow k film 38 is deposited on top of first layer of insulating material 34 and first region of metal 36. Optionally, an additional dielectric cap layer (not shown) may be added between layer 34 and layer 38. First layer of insulating material 34 may be suitably formed of silicon oxide, silicon nitride, doped varieties of these materials, or any other suitable insulating materials. Ultralow k film 38 is patterned by a photolithography process and conductor layer 40 is formed therein. After a CMP process on first conductor layer 40 is carried out, second layer of ultralow k film 44 is deposited by a plasma enhanced chemical vapor deposition ("PECVD") process overlying first ultralow k film 38 and first conductor layer 40. Conductor layer 40 may be formed of a metallic conductive material or a non-metallic conductive material. For instance, a metallic conductive material of aluminum or copper, or a non-metallic material such as nitride or polysilicon may be utilized. First conductor 40 is in electrical communication with first region of metal 36.

A second region of conductor 50 is formed, after a photolithographic process in second ultralow k film layer 44 is conducted, followed by a deposition process for the second conductor material. Second conductor 50 may also be formed of either a metallic material or a non-metallic material, similar to that used in forming the first conductor layer 40. The second region of conductor 50 is in electrical communication with the first region of conductor 40 and is embedded in second layer 44 of ultralow k insulator. Second layer 44 of ultralow k film is in intimate contact with first layer 38 of insulating material. In this specific example, first layer 38 of insulating material, which is an ultralow k material according to the present invention, serves as an intralevel dielectric material, while the second layer of insulating material, i.e., the ultralow k film 44, serves as both an intralevel and an interlevel dielectric. Based on the low dielectric constant of the ultralow k film, superior insulating property can be achieved for the first insulating layer 38 and second insulating layer 44.

Figure 2:
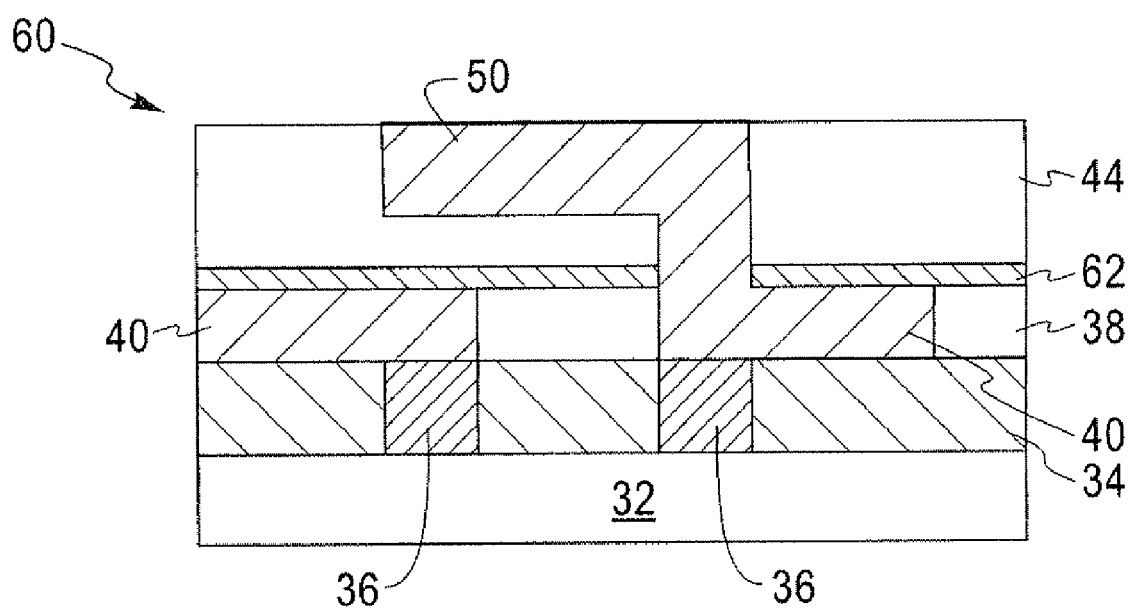
FIG. 2 is a cross section view of an electronic device 60.

FIG. 2 depicts a cross section view of an electronic device 60 according to the present invention, similar to that of electronic device 30 shown in FIG. 1, but with additional dielectric cap layer 62 deposited between first insulating material layer 38 and second insulating material layer 44. Dielectric cap layer 62 can be suitably formed of a material such as silicon oxide, silicon nitride, silicon oxynitride, silicon carbide, silicon carbon nitride (SiCN), silicon carbo-oxide (SiCO), modified ultralow k and their hydrogenated compounds thereof, as well as refractory metal silicon nitride, wherein the refractory metal is selected from the group consisting of: Ta, Zr, Hf; and W. Additionally, dielectric cap layer 62 functions as a diffusion barrier layer for preventing diffusion of first conductor layer 40 into second insulating material layer 44 or into the lower layers, especially into layers 34 and 32.

Figure 3:
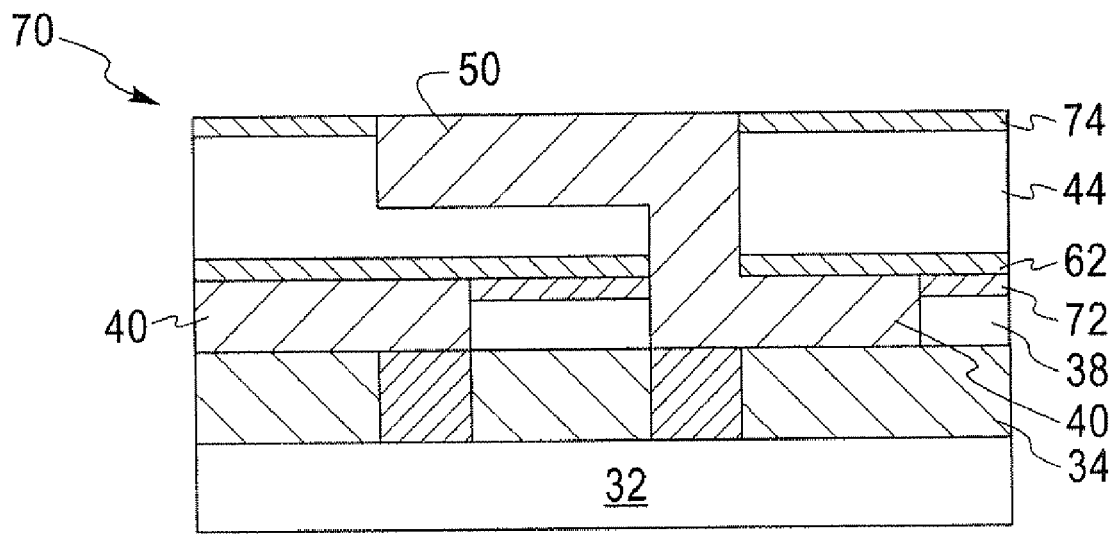
FIG. 3 is a cross section view of an electronic device 70.

FIG. 3 depicts a cross section view of another alternate embodiment of electronic device 70 according to the present invention. In electronic device 70, two additional dielectric cap layers 72 and 74 that act as a RIE mask and a CMP (chemical-mechanical polishing) polish stop layer are used. First dielectric cap layer 72 is deposited on top of first insulating material layer 38. The function of dielectric layer 72 is to provide an end point for the CMP process utilized in planarizing first conductor layer 40. Polish stop layer 72 can be deposited of a suitable dielectric material such as silicon oxide, silicon nitride, silicon oxynitride, silicon carbide, silicon carbo-oxide (SiCO), silicon carbon nitride (SCN), modified ultralow k and hydrogenated compounds thereof, as well as refractory metal silicon nitride, wherein the refractory metal is selected from the group consisting of: Ta, Zr, Hf and W. The top surface of dielectric layer 72 is at the same level as first conductor layer 40. A second dielectric layer 74 can be added on top of second insulating material layer 44 for the same purposes.

Figure 4:
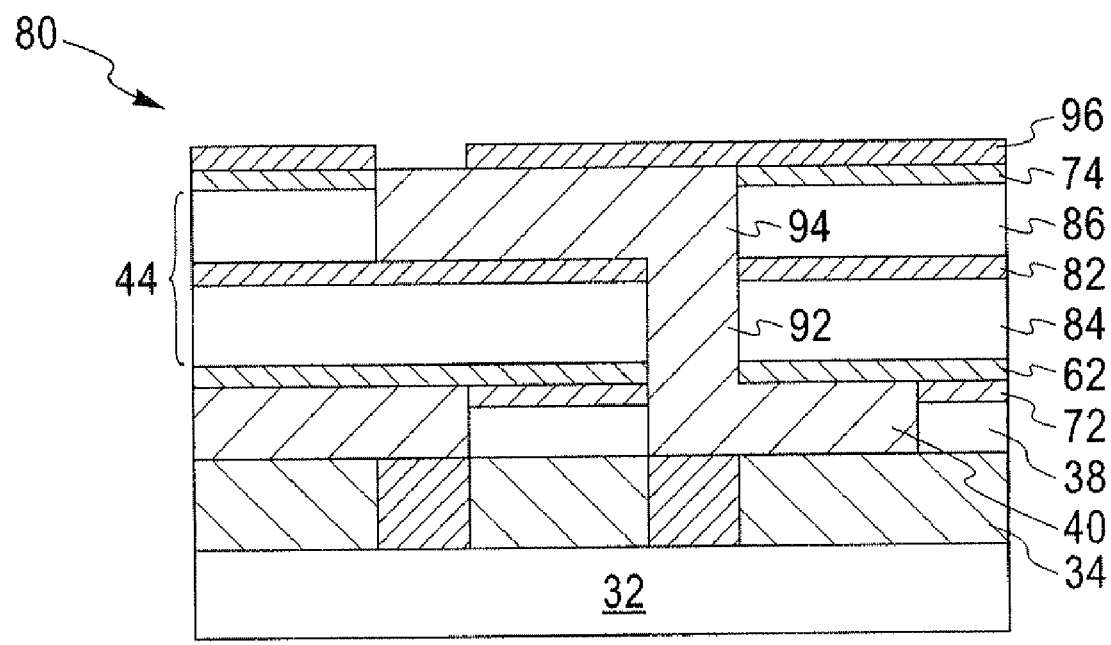
FIG. 4 is a cross section view of an electronic device 80.

FIG. 4 depicts a cross section view of still another alternate embodiment of electronic device 80 according to the present invention. In this alternate embodiment, an additional layer of dielectric 82 is deposited and thus divides second insulating material layer 44 into two separate layers 84 and 86. Intralevel and interlevel dielectric layer 44, as depicted in FIG. 3, is therefore divided into interlayer dielectric layer 84 and intralevel dielectric layer 86. There may be a boundary between interconnect 92 and interconnect 94 coplanar with the interface between dielectric 82 and intralevel dielectric layer 86. An additional diffusion barrier layer 96 is further deposited on top of the upper dielectric layer 74. The additional benefits provided by this alternate embodiment of the electronic structure 80 is that the dielectric layer 82 acts as a RIE etch stop providing superior interconnect 94 depth control, and hence superior control over the conductor resistance.

The following examples are presented to illustrate the fabrication of the ultralow k dielectric film in accordance with the present invention as well as to demonstrate advantages that can be obtained therefrom:

EXAMPLE 1

In this example, two types of SiCOH films were deposited on Si wafers. The first type of SiCOH film was an ultra-low k dielectric film deposited by means of PECVD, and which in as-deposited state contained a matrix based on the precursor diethoxymethylsilane (DEMS) and an organic phase that can later be removed by means of an energy source, in accordance with U.S. Ser. No. 10/758,724, to stabilize the film and improve its properties (electrical, mechanical, adhesive), resulting in a final optimum film. Suitable energy sources include thermal, chemical, ultraviolet (UV) light, EB, RF, microwave, and plasma. Combinations of the aforementioned energy sources can also be used in the present invention. Within the present invention, the ambient for thermal, UV, EB, laser, or RF treatment is done in an environment comprising an inert gas such as $N_2$, $H_2$, Ar, He, Xe, or other noble gas or a hydrocarbon gas or a mixture thereof, and containing a concentration of $O_2$ in the range from 0 to 10 ppm.

The second type of SiCOH film was a film based on a mixture of methylsilsesquioxane (MSQ) and hydrogen silsesquioxane (HSQ) which was deposited onto the Si substrate by spin-coating from solution. This film can later be treated by an energy source, in accordance with U.S. Ser. No. 10/758,724, to stabilize the film and improve its properties (electrical, mechanical, adhesive), resulting in a final optimum film. Suitable energy sources include thermal, chemical, ultraviolet (UV) light, EB, RF, microwave, and plasma. Combinations of the aforementioned energy sources can also be used in the present invention. Within the present invention, the ambient for thermal, UV, EB, laser, or RF treatment is done in an environment comprising an inert gas such as $N_2$, $H_2$, Ar, He, Xe, or other noble gas or a hydrocarbon gas or a mixture thereof, and containing a concentration of $O_2$ in the range from 0 to 10 ppm.

Figure 5:
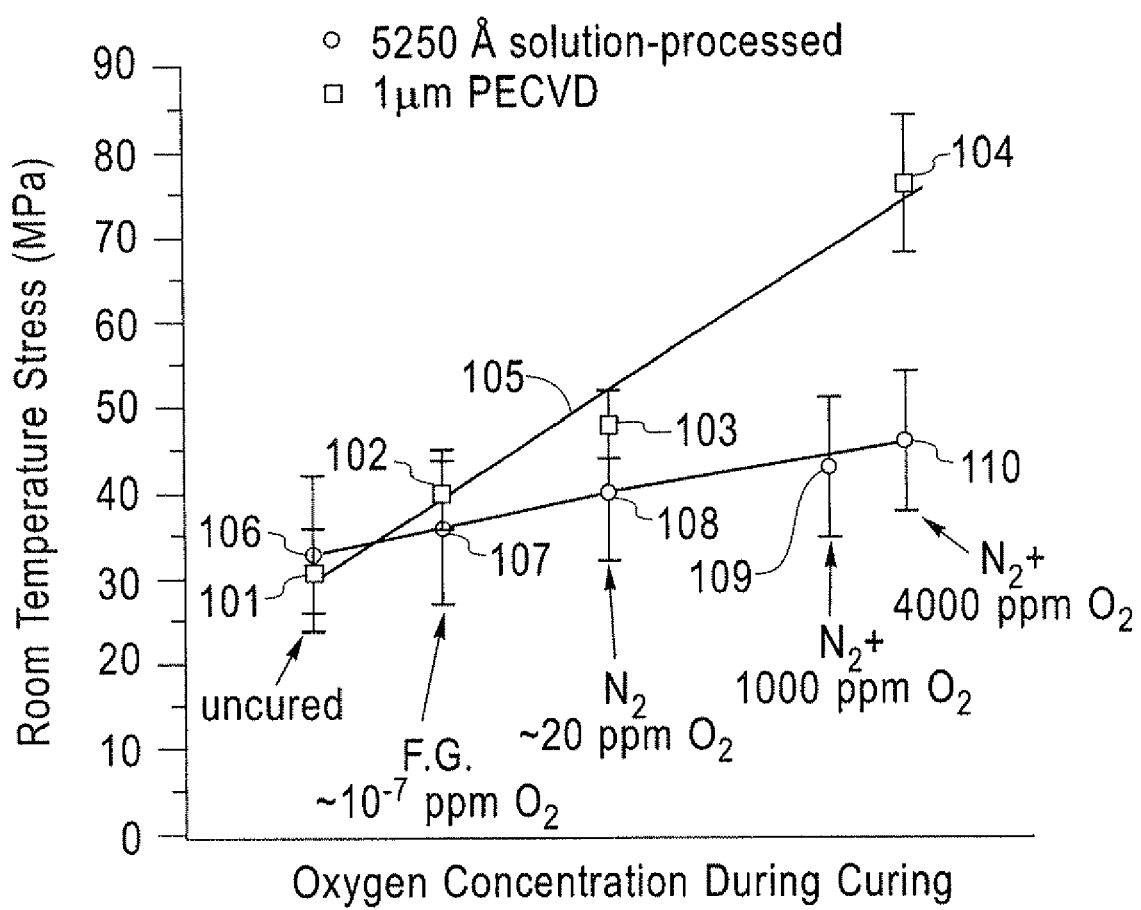
FIG. 5 is a graph of the stress in films at room temperature as a function of the oxygen concentration during curing of the films.

Pieces from SiCOH films formed by PECVD (the first type of film) and by a mixture of MSQ and HSQ spin coated (the second type of film) were annealed at 400° C. for in different gases that contained varying quantities of oxygen. FIG. 5 shows plots of film biaxial stress vs. oxygen content in the gas environment during the anneal step, the higher the oxygen content in the gas environment, the higher the resulting film biaxial stress after the anneal and applies to both the PECVD and the solution processed spin coated SiCOH films. In FIG. 5, the ordinate represents room temperature biaxial stress and the abscissa represents oxygen concentration in the gas environment during curing. In FIG. 5, data points 101-104 were plotted and curve 105, a straight line, correspond to the PECVD SiCOH film while the data points 106-110 and curve 111, a straight line, correspond to the solution processed spin coated SiCOH film.

The as-deposited film of the PECVD SiCOH film has a biaxial stress of 31 MPa (the error bar for this biaxial stress measurement is 5 MPa) as shown in Tables Ia and FIG. 5.

TABLE Ia

| O2 content in anneal gas (ppm) | Thickness (μm) | Stress (MPa) |
|---|---|---|
| no anneal (uncured) | 1 | 31 ± 5 |
| Forming gas ($10^{-7}$ ppm) | 0.84 | 40 ± 4 |
| 20 | 0.84 | 48 ± 4 |
| 4000 | 0.84 | 76 ± 8 |

TABLE Ib

| O2 content in anneal gas (ppm) | Thickness (μm) | Stress (MPa) |
|---|---|---|
| Forming gas ($10^{-7}$ ppm) | 0.84 | 34 ± 7 |
| 20 | 0.84 | 39 ± 8 |
| 1000 | 0.84 | 50 ± 7 |

The biaxial stress of the annealed SiCOH film increases up to 76 MPa when the film is annealed in an atmosphere containing 4000 ppm of oxygen.

Table Ib exhibits the results of a repeat experiment involving the PECVD SiCOH film.

The results of the repeat experiment shown in Table Ib are in agreement with the results of the first experiment shown in Table Ia.

The as-deposited film of the solution processed spin coated SiCOH film has a biaxial stress of 33 MPa (the error bar for this stress measurement is 9 MPa) as shown in Table II and FIG. 5.

TABLE II

| O2 content in anneal gas (ppm) | Thickness (Å) | Stress (MPa) |
|---|---|---|
| Uncured | 5250 | 33 ± 9 |
| Forming gas (1 ppm) | 5250 | 36 ± 9 |
| 20 | 5250 | 40 ± 8 |
| 1000 | 5250 | 43 ± 5 |
| 4000 | 5250 | 46 ± 8 |

The biaxial stress of the annealed spin coated SiCOH film at room temperature increases up to 46 MPa when the SiCOH film is annealed in an atmosphere containing 4000 ppm of oxygen.

Figure 6:
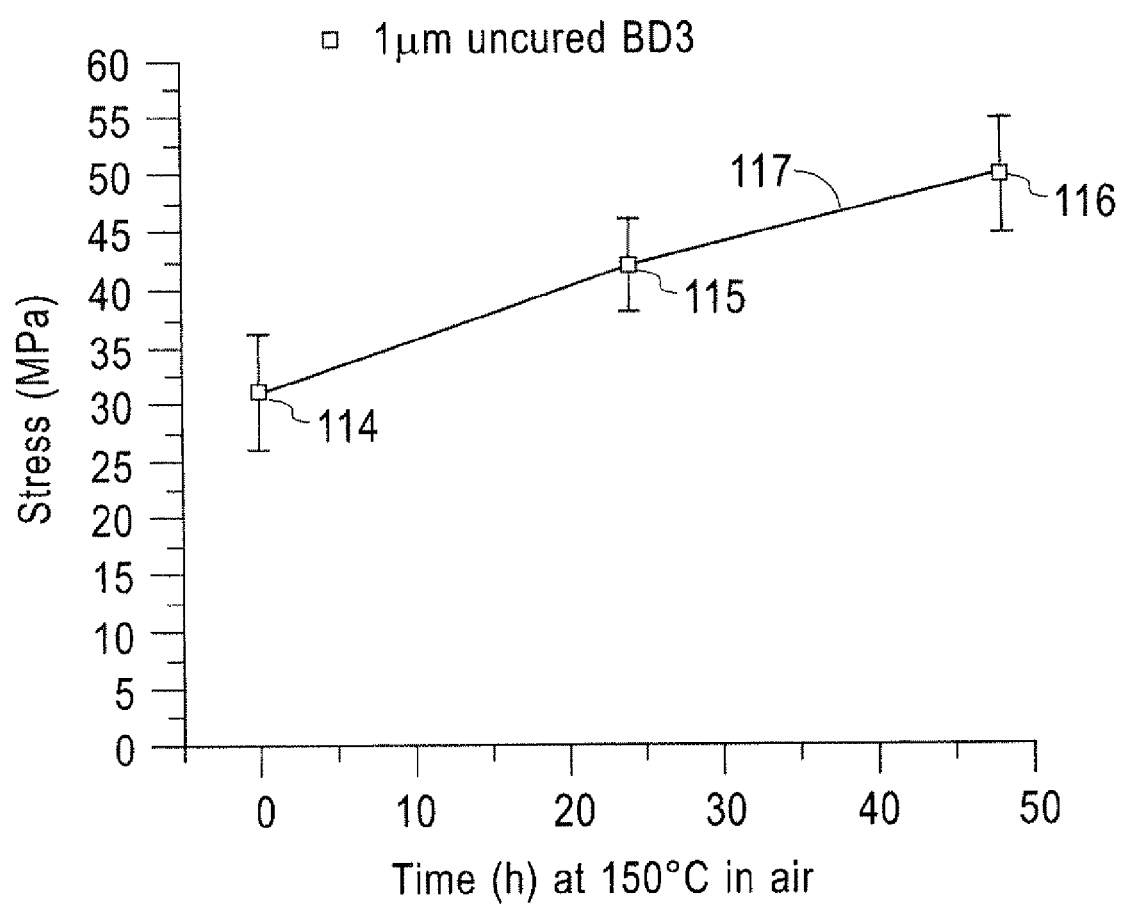
FIG. 6 is a graph of the stress in a PECVD SiCOH film versus time of anneal at 150 C in air.

FIG. 6 shows data points 114-116 and curve 117 showing room temperature biaxial stress in an annealed PECVD SiCOH film. In FIG. 6, the ordinate represents biaxial stress and the abscissa represents time in air. In FIG. 6, data was obtained from pieces of the as-deposited PECVD SiCOH film after annealing in air at 150C for up to about 50 hours. As shown by curve 117 in FIG. 6, the biaxial stress increases monotonically with the time of anneal in air. FIG. 6 shows that annealing an as-deposited PECVD SiCOH film in the presence of $O_2$ results in an increase of the biaxial stress of the PECVD SiCOH film.

Figure 7A:
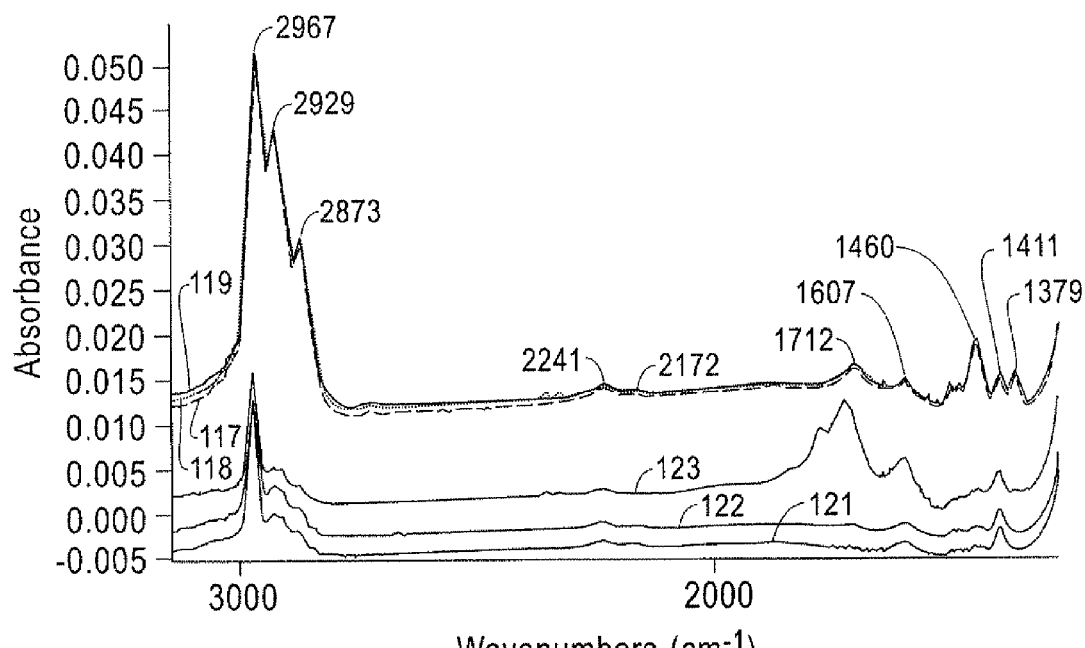
FIGS. 7A and 7B are plots of the same graph having different abscissa scales showing FTIR spectra from three PECVD ultra low k films.
Figure 7B:
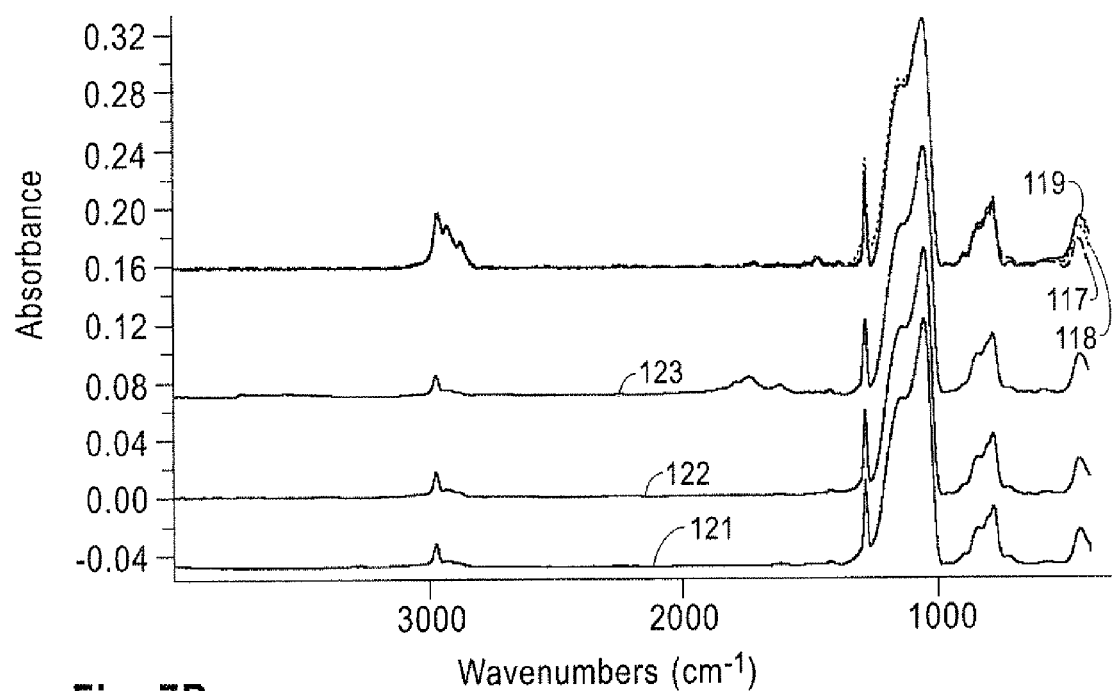

FIGS. 7A and 7B show FTIR spectra from ultralow k SiCOH films incorporated in the first embodiment shown in FIG. 1. FIG. 7A is a zoomed in version of FIG. 7B. FIG. 7A shows curves 117-119 of FTIR spectra obtained from three PECVD ultralow k SiC OH films prepared from a mixture of DEMS and an organic precursor before annealing. Curves 121-123 show FTIR spectra after anneal in gas environments or atmospheres with different $O_2$ content for each of the three pieces of the as-deposited PECVD ultralow k SiCOH films that were also measured for FTIR spectra shown by curves 117-119 before annealing on the three pieces respectively.

The following three anneal conditions were used:
1. Forming Gas Anneal at 400° C. for 14 h.
2. $N_2$ Gas Anneal with 10 ppm $O_2$ at 400° C. for 14 h.
3. $N_2$ Gas Anneal with 300 ppm $O_2$ at 400° C. for 14 h.

In FIGS. 7A and 7B, the ordinate represents Absorbance and the abscissa represents Wavenumbers ($cm^{-1}$) for FTIR spectra. In FIGS. 7A and 7B, the data shown by curves 121-123 show that the chemical bonds comprising the film structure are different for the three anneal environments used. Curve 121 is for anneal condition 1 above i.e. forming gas anneal. Curve 122 if for anneal condition 2 above i.e. $N_2$ gas anneal with 10 ppm $O_2$. Curve 123 is for anneal condition 3 above i.e. $N_2$ gas anneal with 300 ppm $O_2$. All six spectra (from the three as deposited films and the same films after the three different annealing treatments) in FIG. 7B display the composite Si—O absorption band between 980 and 1250 $cm^{-1}$. All six spectra (from the three as deposited films and the same films after the three different annealing treatments) in FIGS. 7A and 7B display the $S_1$—$CH_3$ absorption peak at about 1268 $cm^{-1}$ and the overlapping $CH_x$ absorption peaks at about 2800-3050 $cm^{-1}$. Other relevant bands that exist in these spectra are attributed to the following chemical moieties:

The peak or peaks in the region from at 1700 to 1800 $cm^{-1}$ are attributed to C═O with various nearest neighbor atoms.
The peak at 1607 $cm^{-1}$ is attributed to C═C.
The peak at 1460 $cm^{-1}$ is attributed to $CH_2$ isolated from Si.
The peak at 1411 $cm^{-1}$ is attributed to $CH_3$ from $SiMe_x$.
The peak at 1378 $cm^{-1}$ is attributed to $CH_2$ from $SiCH_2Si$
The peaks at 2241 and 2172 $cm^{-1}$ is attributed to $HSiO_3$ and $HSiO_2Si$, respectively.

Figure 8A:
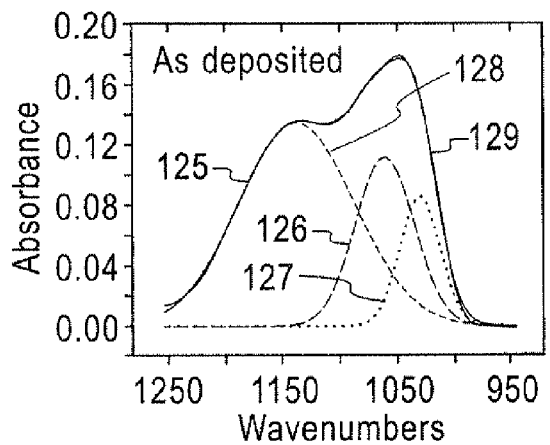
FIGS. 8A-10B are graphs of FTIR spectra for as-deposited films and for the same films after annealing.
Figure 8B:
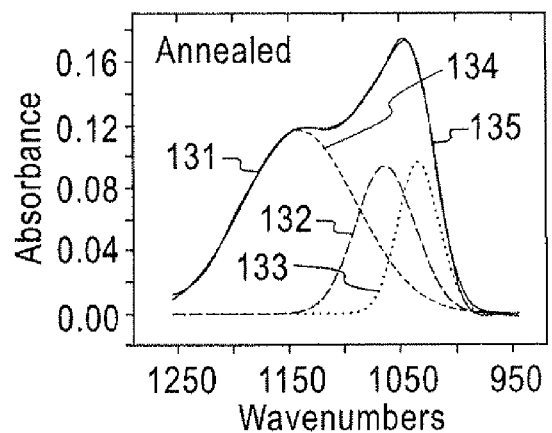
Figure 9A:
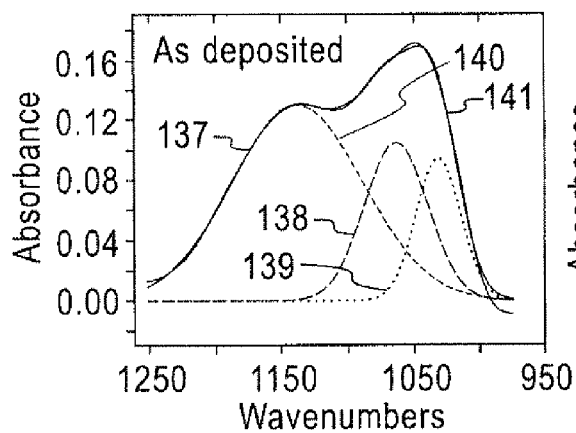
Figure 9B:
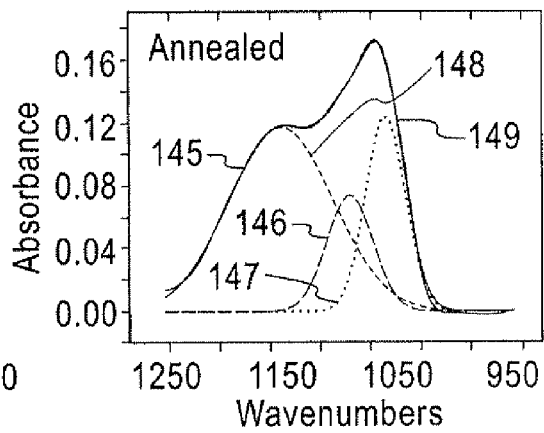
Figure 10A:
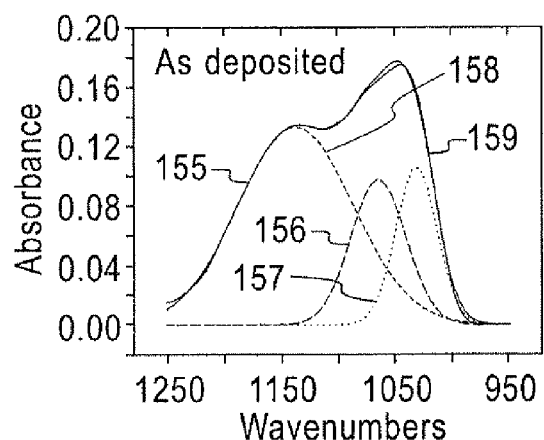
Figure 10B:
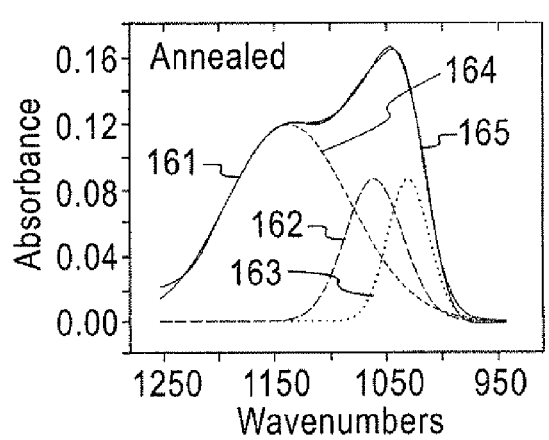

One characteristic of the FTIR spectra of the ultralow k SiCOH films shown in FIG. 7B by curves 121-123 is that the Si—O peak can be deconvoluted into 3 peaks centered at approximately 1141 $cm^{-1}$, 1064 $cm^{-1}$ and 1030 $cm^{-1}$, as it is particularly illustrated in FIGS. 8B, 9B, and 10B for the three different anneal conditions 1-3 (FIG. 8B: Condition 1, Forming Gas Anneal at 400° C. for 14 h; FIG. 9B: Condition 2, $N_2$ Gas Anneal with 10 ppm $O_2$ at 400° C. for 14 h; FIG. 10B: Condition 3, $N_2$ Gas Anneal with 300 ppm $O_2$ at 400° C. for 14 h). In FIGS. 8A, 8B, 9A, 9B, 10A and 10B, the ordinate represents Absorbance and the abscissa represents Wavenumbers ($cm^{-1}$).

The Si—O peak FTIR spectra is shown in FIG. 8A by curves 125 and 129, in FIG. 8B by curves 131 and 135, in FIG. 9A by curves 137 and 141, in FIG. 9B by curves 145 and 149, in FIG. 10A by curves 155 and 159 and in FIG. 10B by curves 161 and 165.

The 3 peaks formed as a result of the Si—O peak being deconvoluted are centered at approximately 1141 $cm^{-1}$, 1064 $cm^{-1}$ and 1030 $cm^{-1}$ and are shown in FIG. 8A by curves 125-128, in FIG. 8B by curves 131-134, in FIG. 9A by curves 137-140, in FIG. 9B by curves 145-148, in FIG. 10A by curves 155-158 and in FIG. 10B by curves 161-164.

The different ratios of these three peaks centered at approximately 114 $cm^{-1}$, 1064 $cm^{-1}$ and 1030 $cm^{-1}$ in the films annealed under different environments will be used to make conclusions regarding the structure of these PECVD ultra low k SiCOH films.

General conclusions from the FTIR spectra include the following statements:
After annealing in conditions 1-3
  $CH_x$ content in the film decreases, which indicates loss of porogen.
  The total SiOSi bond content increases which indicates that crosslinking has increased.
  $SiCH_3$ bend intensity increased meaning that porosity increased resulting in less shielding of the vibration
After annealing in Condition 1, Forming Gas at 400° C. for 14 h or in Condition 2, $N_2$ gas with 10 ppm $O_2$ at 400° C. for 14 h
  network peak intensity remains mostly the same, which means that SiOSi bond content is retained.
  suboxide peak intensity increased, which is explained by Si—Si crosslink formation.
  SiH peak intensity decreased, which means that this moiety is involved in Si—Si crosslinking reactions
  C═O peak intensity decreased, which means that loss of porogen took place, and the C═O bond was reduced.
  $CH_2$ (Si free) peak intensity decreased, which means that loss of porogen took place.
  The $SiCH_2Si$ disappears, which means that it is lost to Si—Si crosslink formation.
After annealing in Condition 3, $N_2$ gas with 300 ppm $O_2$ at 400° C. for 14 h
  The SiOSi network peak intensity increased which means that more SiOSi bonds were formed.
  The SiOSi suboxide peak intensity decreased which means that more SiOSi bonds were formed by these anneals and SiX bonds where X is not O were eliminated.

The total SiH peak intensity decreased, while the peak due to H—SiO$_2$Si disappeared completely. This can be linked to creation of new SiOSi crosslinking bonds.

The C═O peak intensity increased, which means that oxidation of organic components in SiCOH took place.

The CH$_2$ (Si free) peak intensity increased, which means that porogen is trapped in the film The SiCH$_2$Si peak intensity is retained After annealing in Condition 3, N$_2$ Gas with 300 ppm O$_2$ at 400° C. for 14h or in Condition 2, N$_2$ Gas with 10 ppm O$_2$ at 400° C. for 14 h, the C═C peak intensity increases, possibly due to carbonate formation. On the contrary the C═C peak remains the same or decreases in films that were annealed in Condition 1, pure forming gas at 400° C. for 14 h.

Figure 11:
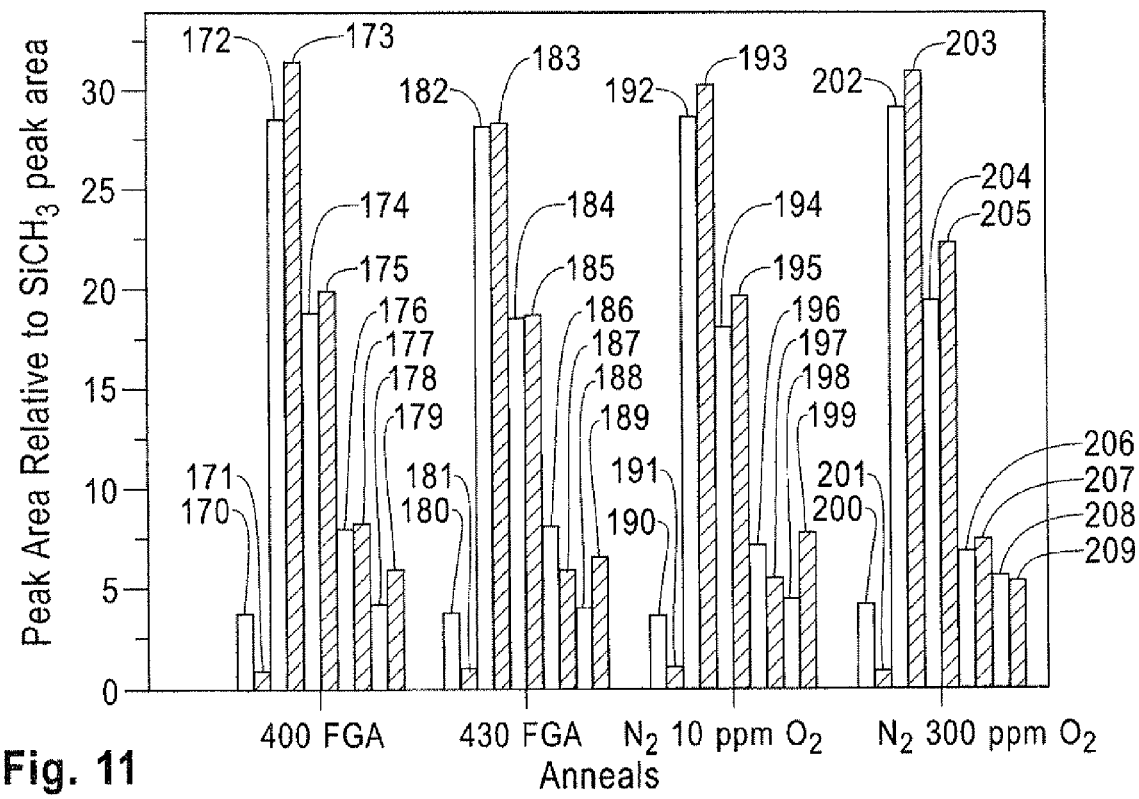
FIG. 11 is a graph showing the intensity of various peaks normalized versus the SiCH$_3$ bend peak intensity.

FIG. 11 shows the intensity of the various peaks normalized versus the SiCH$_3$ bend peak intensity. In FIG. 11, the ordinate represents various peak areas relative to SiCH$_3$ bend peak area. The abscissa represents SiCOH films annealed in forming gas, N$_2$ gas 10 ppm O$_2$ and N$_2$ gas 300 ppm O$_2$.

Curves 170, 180, 190 and 200 represent peak areas relative to SiCH$_3$ bend peak area for as-deposited Chx. Curves 171, 181, 191 and 201 represent peak areas relative to SiCH$_3$ bend peak area for annealed Chx. Curves 172, 182, 192 and 202 represent peak areas relative to SiCH$_3$ bend peak area for as-deposited total SiOSi. Curves 173, 183, 193 and 203 represent peak areas relative to SiCH$_3$ bend peak area for annealed total SiOSi. Curves 174, 184, 194 and 204 represent peak areas relative to SiCH$_3$ bend peak area for as-deposited cage. Curves 175, 185, 195 and 205 represent peak areas relative to SiCH$_3$ bend peak area for annealed cage. Curves 176, 186, 196 and 206 represent peak areas relative to SiCH$_3$ bend peak area for as-deposited network. Curves 177, 187, 197 and 207 represent peak areas relative to SiCH$_3$ bend peak area for annealed network. Curves 178, 188, 198 and 208 represent peak areas relative to SiCH$_3$ bend peak area for as-deposited suboxide. Curves 179, 189, 199 and 209 represent peak areas relative to SiCH$_3$ bend peak area for annealed suboxide.

Curves 170-179 are for a SiCOH film annealed in forming gas. Curves 180-189 are for another SiCOH film annealed in forming gas. Curves 190-199 are for SiCOH films annealed in N$_2$ gas with 10 ppm O$_2$. Curves 200-209 are for SiCOH films annealed in N$_2$ gas with 300 ppm O$_2$. FIG. 11, curves 170-209 quantifies the relative peak intensity changes as a function of SiCOH film anneal conditions, and based on these curves, the above conclusions were made. The SiCH$_3$ bend peak intensity was selected as a reference intensity because when normalized vs. the total SiOSi peak intensity, the SiCH$_3$ bend peak intensity remains constant before and after annealing as shown in FIG. 12, curves 212, 213, 222, 223, 232, 233, 242 and 243.

Figure 12:
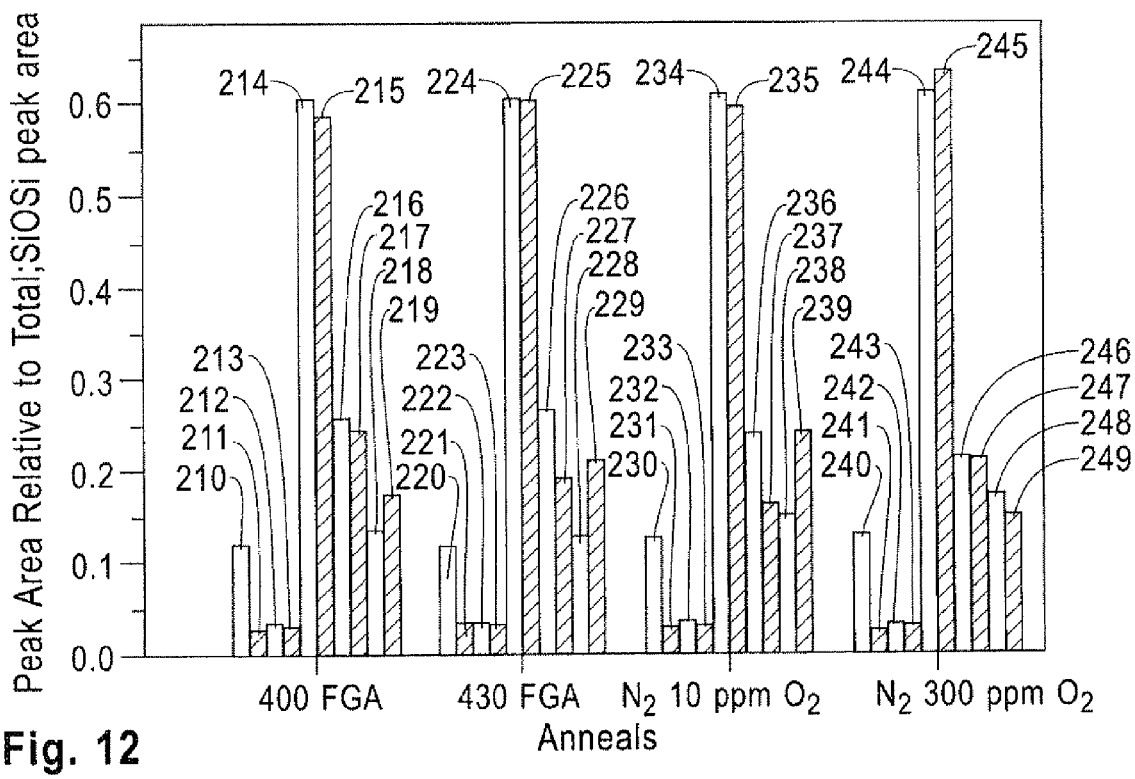
FIG. 12 is a graph showing the intensity of various peaks normalized versus the SiOSi peak intensity.

In FIG. 12, the ordinate represents various peak areas relative to SiOSi peak area. The abscissa represents SiCOH films annealed in forming gas, N$_2$ gas 10 ppm O$_2$, and N$_2$ gas 300 ppm O$_2$.

Curves 210, 220, 230 and 240 represent peak areas relative to SiOSi total peak area for as-deposited CHx. Curves 211, 221, 231 and 241 represent peak areas relative to SiOSi total peak area for annealed CHx. Curves 212, 222, 232 and 242 represent peak area relative to SiOSi total peak area for as-deposited SiCH$_3$. Curves 213, 223, 233 and 243 represent peak area relative to SiOSi total peak area for annealed SiCH$_3$. Curves 214, 224, 234 and 244 represent peak area relative to SiOSi total peak area for as-deposited cage. Curves 215, 225, 235 and 245 represent peak area relative to SiOSi total peak area for annealed cage. Curves 116, 226, 236 and 246 represent peak area relative to SiOSi total peak area for as-deposited network. Curves 117, 227, 237 and 247 represent peak area relative to SiOSi total peak area for annealed network. Curves 118, 228, 238 and 248 represent peak area relative to SiOSi total peak area for as-deposited suboxide. Curves 119, 229, 239 and 249 represent peak area relative to SiOSi total peak area for annealed suboxide.

Curves 210-219 are for a SiCOH film annealed in forming gas. Curves 220-229 are for another SiCOH film annealed in forming gas. Curves 220-229 are for a SiCOH film annealed in N2 gas with 10 ppm O$_2$. Curves 240-249 are for a SiCOH film annealed in N2 gas with 300 ppm O$_2$.

EXAMPLE 2

In this example, a specific composition of an ultra-low k SiCOH film was deposited on Si wafers by means of PECVD. In the as-deposited state these SiCOH films contained a matrix based on the precursor DEMS and an organic phase that was later removed by means of UV light exposure at elevated temperature to stabilize the SiCOH film and improve its properties (electrical, mechanical, adhesive), resulting in a final optimum SiCOH film on the Si wafers.

The SiCOH film on respective Si wafers were UV cured, treated or annealed in three different gas environments. The three different gas environments were: a noble gas such as He or Ar, He mixed with H$_2$, and O$_2$. For the UV treatments, the substrate temperature was maintained for 20 minutes at 400° C. during the treatment, and the same UV lamp was used for the UV treatments.

Figure 13:
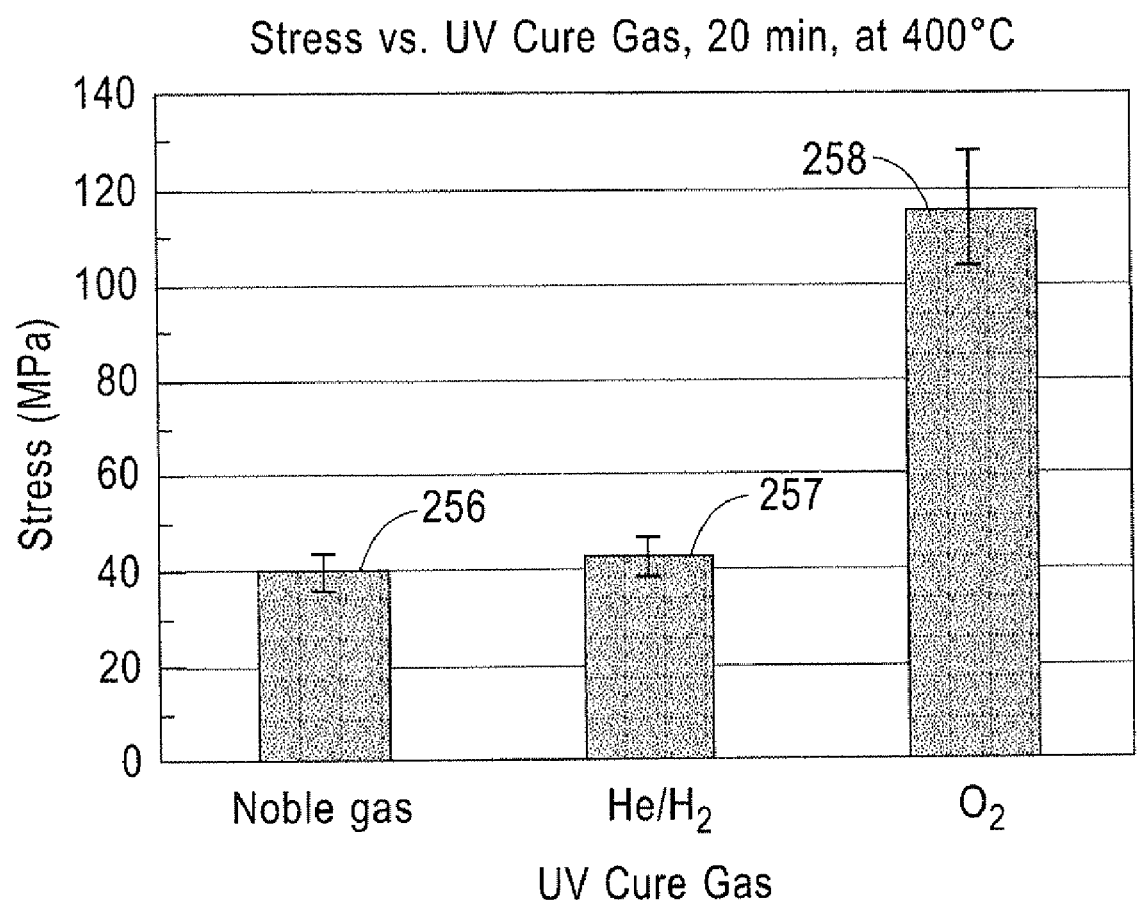
FIG. 13 is a graph of the film stress as a function of several annealing gas environments.

FIG. 13, shows the biaxial stress of a SiCOH film on a Si wafer after UV treatment. In FIG. 13, the ordinate represents biaxial stress and the abscissa represents SiCOH film annealed in three gas environments: noble gas environment, a mixture of He and H$_2$, and a gas environment of O$_2$.

Curve 256 is for a noble gas environment and shows a biaxial stress of about 40 MPa. Curve 257 is for a mixture of He and H$_2$ gas and shows a biaxial stress of about 42 MPa. Curve 258 is for a gas environment of O$_2$ and shows a biaxial stress of about 117 MPa. Curve 258 shows that the gas environment of O$_2$ during UV cure dramatically increase the biaxial stress in the films to about 117 MPa compared to 40 MPa for curve 256 and 42 MPa for curve 257. A biaxial stress of 117 MPa is not desirable since biaxial stress promotes cracking of the dielectric films such as SiCOH films. A biaxial stress less than 46 MPa is desirable and less than 40 MPa is preferred in the film. Thus in order to provide low biaxial stress SiCOH films, O$_2$ is excluded from the cure chamber during the UV curing or other energetic treatment of SiCOH films by keeping the O$_2$ concentration in the range from 0 to 10 ppm.

Figure 14:
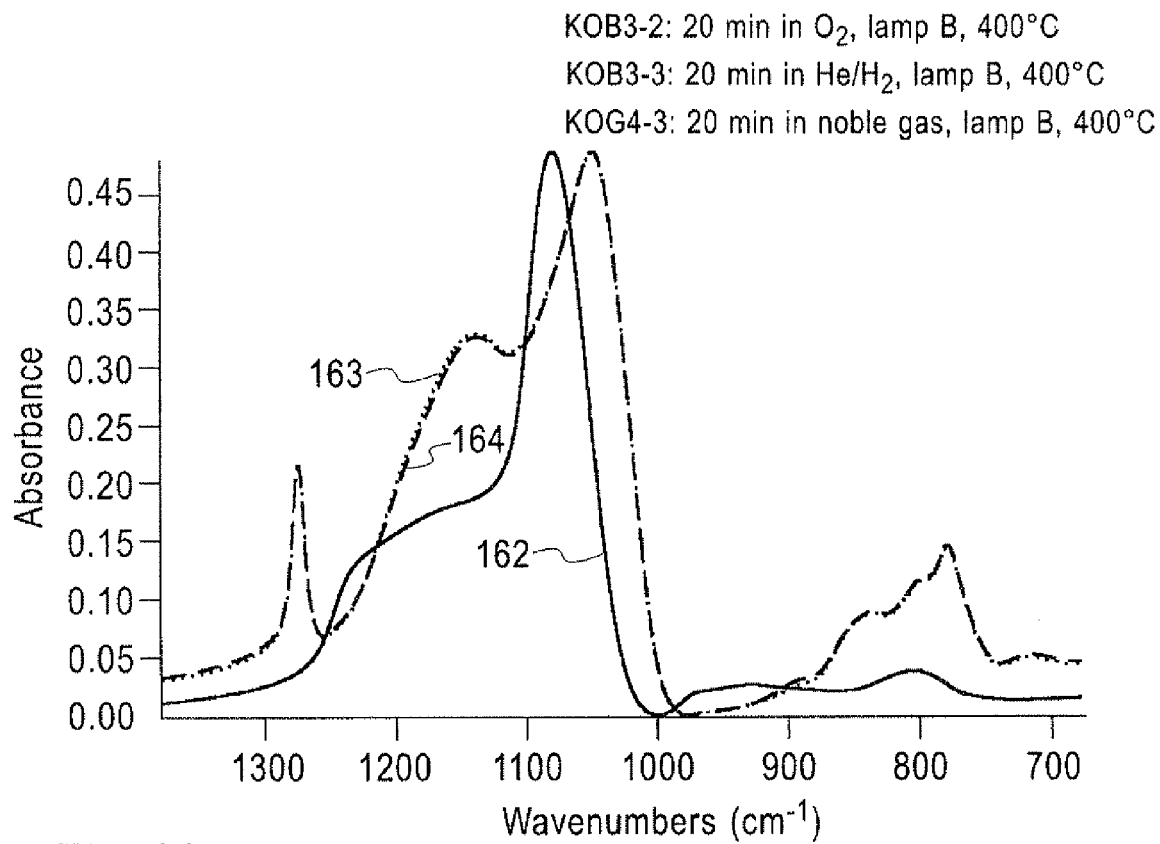
FIGS. 14-16 are graphs of FTIR spectra obtained from three PECVD films after annealing in in three different gas environments.
Figure 15:
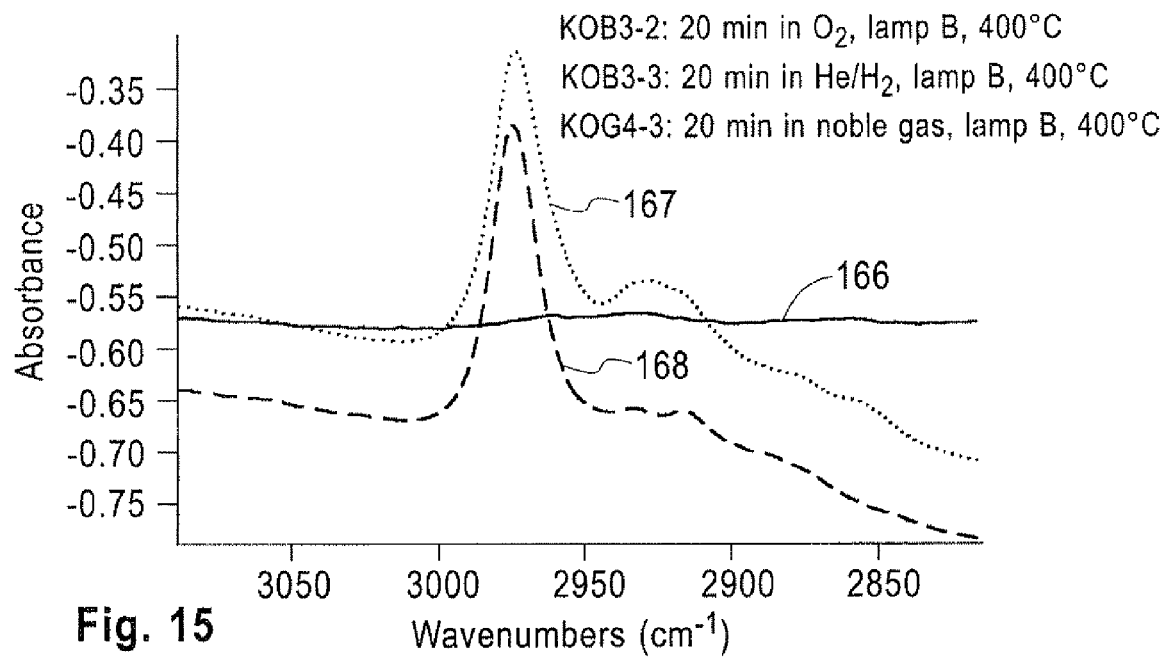
Figure 16:
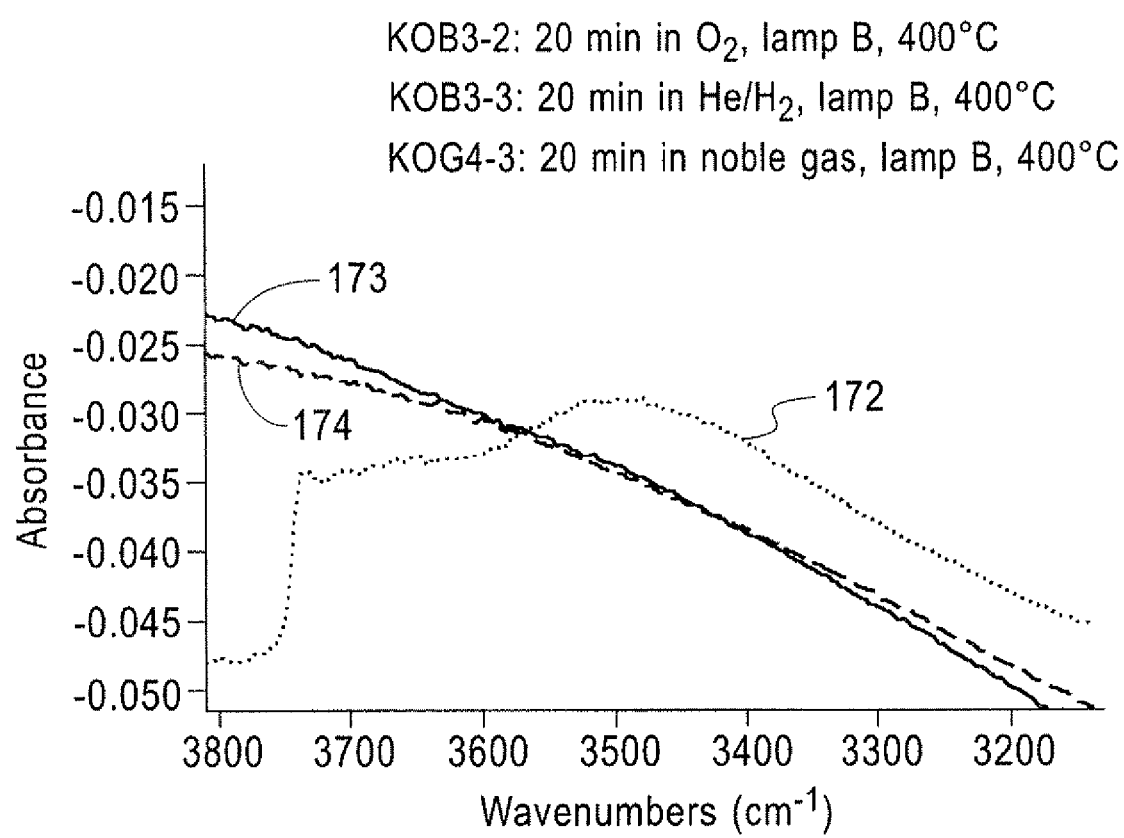

Results of the second embodiment are now discussed with reference to FIGS. 14, 15 and 16. FIGS. 14-16 show the FTIR spectra obtained from three PECVD ultralow k films. In FIGS. 14-16, the ordinate represents absorbance and the abscissa represents wavenumbers. The three films were prepared from a mixture of DEMS and an organic precursor before and after UV curing in three different gases: a noble gas shown by curve 164 in FIG. 14, curve 168 in FIG. 15 and curve 174 in FIG. 16, a gas mixture of He and H$_2$ shown by curve 163 in FIG. 14, curve 167 in FIG. 15 and curve 173 in FIG. 16 and a gas environment of O$_2$ shown by curve 162 in FIG. 14, curve 166 in FIG. 15 and curve 172 in FIG. 16.

Curves 162, 166 and 172 show that the FTIR spectra of the sample annealed in a gas environment of $O_2$ is very different from the FTIR spectra of the other two samples annealed in a gas environment of noble gas or in a gas mixture of He and $H_2$ (curves 163, 167 and 173). In the SiCOH film annealed in a gas environment of $O_2$, there is almost a complete depletion of C containing moieties, and in the SiOSi peak region it is clear that the cage peak has been reduced and the network peak has been dramatically increased. Another observation is OH related features in the FTIR spectra.

Results of the second embodiment are now discussed in reference to FIGS. 14, 15 and 16. These figures present the FTIR spectra obtained from 3 PECVD ultralow k films prepared from a mixture of DEMS and an organic precursor before and after UV curing in three different gases a noble gas, a mixture of He and $H_2$, and $O_2$. We see that the spectrum of the $O_2$ annealed sample is very different than the other two samples. Almost complete depletion of C containing moieties has taken place in the $O_2$ annealed sample, as evidenced by the absence of the $S_1$—$CH_3$ peak around 1270 $cm^{-1}$ in the relevant spectrum of FIG. 14, and by the absence of CHx vibrations from 2800 to 3050 $cm^{-1}$ in the relevant spectrum of FIG. 15. From the SiOSi peak region in the spectrum of the $O_2$ annealed sample in FIG. 14 it is clear that the intensity of the cage peak around 1150 $cm^{-1}$ has been reduced and the intensity of the network peak between 1100 and 1000 $cm^{-1}$ has been dramatically increased thus exhibiting a much lower cage to network peak intensity ratio than the samples cured in a noble gas or a $He/H_2$ atmosphere. Another observation is the existence of OH related features in the spectrum of the $O_2$ annealed sample. Such features are almost absent in the case of the samples cured in a noble gas or a $He/H_2$ atmosphere.

While the present invention has been described in an illustrative manner, it should be understood that the terminology used is intended to be in a nature of words of description rather than of limitation.

Furthermore, while the present invention has been particularly shown and described with respect to a preferred embodiment and several alternate embodiments, it is to be appreciated that those skilled in the art may readily apply these teachings to other possible variations of the present invention without departing from the spirit and scope of the present invention.

The embodiments of the present invention in which exclusive property or privilege is claimed are defined below in the appended claims.

Having thus described our invention, what we claim as new and desire to secure by Letters Patent is:

1. An ultralow dielectric constant film comprising atoms of Si, C, O and H, said ultralow dielectric constant film having a covalently bonded tri-dimensional network structure, a FTIR spectrum having no Si—$CH_2$—Si bonding, a dielectric constant of not more than about 2.8, a controlled porosity having molecular scale voids of between about 0.5 to about 30 nanometers in diameter, said molecular scale voids occupy a volume of between about 5% and about 40% and exhibiting biaxial stress less than 46 MPa.

2. The film of claim 1 wherein said biaxial stress of said film does not exceed 40 MPa.

3. The film of claim 1 wherein the biaxial stress of said film does not exceed the stress of an as-deposited, uncured version of said film by more than 5 MPa.

4. The film of claim 1 wherein said film has a dielectric constant in the range from about 1.5 to about 2.8.

5. The film of claim 1 wherein said film comprises about 5 to about 40 atomic percent of Si; about 5 to about 45 atomic percent of C; about 0 to about 50 atomic percent of O; and about 10 to about 55 atomic percent of H.

6. An electronic structure comprising at least a dielectric material comprising atoms of Si, C, O and H, said dielectric material having a covalently bonded tri-dimensional network structure, a FTIR spectrum having no Si—$CH_2$—Si bonding, a dielectric constant of not more than about 2.8, a controlled porosity having molecular scale voids of between about 0.5 to about 30 nanometers in diameter, said molecular scale voids occupying a volume of between about 5% and about 40% and controlled biaxial stress not higher than one of 46 MPa and the stress of an as-deposited, uncured version of said material by more than S MPa.

7. The electronic structure of claim 6 wherein the said dielectric material is used in one of a back-end-of-the-line (BEOL) interconnect interlevel, a BEOL interconnect intralevel, a cap layer, a hardmask, CMP-stop layer and an etch-stop layer.

* * * * *